United States Patent
Wu et al.

(10) Patent No.: US 11,699,389 B2
(45) Date of Patent: *Jul. 11, 2023

(54) DISPLAY PANEL HAVING OPTICAL COMPONENT REGION AND DISPLAY DEVICE

(71) Applicant: Wuhan Tianma Micro-Electronics Co., Ltd., Wuhan (CN)

(72) Inventors: Fengyun Wu, Wuhan (CN); Yawei Wang, Wuhan (CN); Dongxu Xiang, Wuhan (CN); Yangzhao Ma, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/709,801

(22) Filed: Mar. 31, 2022

(65) Prior Publication Data

US 2022/0223101 A1 Jul. 14, 2022

Related U.S. Application Data

(63) Continuation of application No. 17/020,127, filed on Sep. 14, 2020, now Pat. No. 11,335,246.

(30) Foreign Application Priority Data

Jul. 28, 2020 (CN) .......................... 202010738054.3

(51) Int. Cl.
G09G 3/32 (2016.01)
G09G 3/20 (2006.01)

(52) U.S. Cl.
CPC ............. *G09G 3/32* (2013.01); *G09G 3/2003* (2013.01); *G09G 2300/0452* (2013.01); *G09G 2310/027* (2013.01)

(58) Field of Classification Search
CPC ....................................................... G09G 3/32
(Continued)

(56) References Cited

U.S. PATENT DOCUMENTS

2003/0197666 A1  10/2003  Akimoto et al.
2004/0207583 A1  10/2004  Koo et al.
(Continued)

FOREIGN PATENT DOCUMENTS

CN     107316606 A    11/2017
CN     107886897 A    4/2018
(Continued)

*Primary Examiner* — Long D Pham
(74) *Attorney, Agent, or Firm* — Anova Law Group PLLC (57) ABSTRACT

A display panel and a display device are provided in the present disclosure. The display panel includes a plurality of pixels, including first pixels and second pixels, where each of the first pixels includes a first light-emitting element connected with a first pixel circuit; the first pixel circuit includes a first drive transistor; each of the second pixels includes a second light-emitting element connected with a second pixel circuit; and the second pixel circuit includes a second drive transistor. The display panel further includes a display region, including an optical component region and a first display region, where the first light-emitting element is in the optical component region; the second light-emitting element is in the first display region.

20 Claims, 9 Drawing Sheets (58) Field of Classification Search
USPC .......................................................... 345/690
See application file for complete search history.

(56) References Cited

U.S. PATENT DOCUMENTS

| | | | |
|---|---|---|---|
| 2019/0266944 A1 | 8/2019 | Li | |
| 2020/0227488 A1* | 7/2020 | Xin | ..................... H01L 27/3218 |
| 2020/0251539 A1* | 8/2020 | Fu | ....................... H01L 27/3216 |
| 2020/0286432 A1* | 9/2020 | Zhang | .................. G09G 3/3258 |
| 2021/0065625 A1 | 3/2021 | Wang | |

FOREIGN PATENT DOCUMENTS

| | | |
|---|---|---|
| CN | 108269529 A | 7/2018 |
| CN | 109755282 A | 5/2019 |
| CN | 109817667 A | 5/2019 |
| CN | 110729332 A | 1/2020 |

* cited by examiner

DISPLAY PANEL HAVING OPTICAL COMPONENT REGION AND DISPLAY DEVICE

CROSS-REFERENCE TO RELATED APPLICATION

This application is a continuation application of U.S. patent application Ser. No. 17/020,127, filed on Sep. 14, 2020, which claims the priority of Chinese Patent Application No. 202010738054.3, filed on Jul. 28, 2020, the content of which is incorporated herein by reference in its entirety.

TECHNICAL FIELD

The present disclosure generally relates to the field of display technology and, more particularly, relates to a display panel and a display device.

BACKGROUND

With the continuous development of display technology, consumers may have growing requirements for display panels. Various display panels, such as liquid crystal display panels, organic light-emitting display panels, and the like, have developed rapidly. Accordingly, 3D display, touch display, curved display, ultra-high-resolution display, and anti-peep display are emerging to meet consumer's needs.

In addition to information display functions, appearance requirements of display panels have gradually increased in recent years. Larger screen-to-body ratio is the future market trend. Display panels with under-screen camera structures are favored by consumers. In the display panel with an under-screen camera structure, a camera is disposed under the display region of the display panel, and light passes through the display region of the display panel and is incident on the camera, thereby capturing pictures by the camera. However, disposing the under-screen camera structure in the display panel may worsen the display effect of the display panel.

SUMMARY

One aspect of the present disclosure provides a display panel. The display panel includes a plurality of pixels, including first pixels and second pixels, where each of the first pixels includes a first light-emitting element connected with a first pixel circuit; the first pixel circuit includes a first drive transistor; each of the second pixels includes a second light-emitting element connected with a second pixel circuit; and the second pixel circuit includes a second drive transistor. The display panel further includes a display region, including an optical component region and a first display region, where the first light-emitting element is in the optical component region; the second light-emitting element is in the first display region. The first pixels include first blue pixels, first red pixels, and first green pixels; a width-to-length ratio of a first drive transistor corresponding to a first blue pixel is R1, a width-to-length ratio of a first drive transistor corresponding to a first red pixel is R2, and a width-to-length ratio of a first drive transistor corresponding to a first green pixel is R3. The second pixels include second blue pixels, second red pixels, and second green pixels; a width-to-length ratio of a second drive transistor corresponding to a second blue pixel is R1', a width-to-length ratio of a second drive transistor corresponding to a second red pixel is R2', and a width-to-length ratio of a second drive transistor corresponding to a second green pixel is R3', where R1>R1', R2>R2', and/or R3>R3'. The first pixel circuit includes a first storage capacitor electrically connected to a gate electrode of the first drive transistor; the second pixel circuit includes a second storage capacitor electrically connected to a gate electrode of the second drive transistor; and a capacitance of the first storage capacitor is greater than a capacitance of the second storage capacitor.

Another aspect of the present disclosure provides a display panel. The display panel includes a plurality of pixels, including first pixels and second pixels, where each of the first pixels includes a first light-emitting element connected with a first pixel circuit; the first pixel circuit includes a first drive transistor; each of the second pixels includes a second light-emitting element connected with a second pixel circuit; and the second pixel circuit includes a second drive transistor. The display panel further includes a display region, including an optical component region and a first display region, where the first light-emitting element is in the optical component region; the second light-emitting element is in the first display region. The first pixels include first blue pixels, first red pixels, and first green pixels; a width-to-length ratio of a first drive transistor corresponding to a first blue pixel is R1, a width-to-length ratio of a first drive transistor corresponding to a first red pixel is R2, and a width-to-length ratio of a first drive transistor corresponding to a first green pixel is R3. The second pixels include second blue pixels, second red pixels, and second green pixels; a width-to-length ratio of a second drive transistor corresponding to a second blue pixel is R1', a width-to-length ratio of a second drive transistor corresponding to a second red pixel is R2', and a width-to-length ratio of a second drive transistor corresponding to a second green pixel is R3', where R1>R1', R2>R2', and/or R3>R3'. Among the first drive transistor corresponding to the first blue pixel, the first drive transistor corresponding to the first red pixel, and the first drive transistor corresponding to the first red pixel, at least the first drive transistor corresponding to the first blue pixel has a rectangular shaped channel.

Another aspect of the present disclosure provides a display panel. The display panel includes a plurality of pixels, including first pixels and second pixels, where each of the first pixels includes a first light-emitting element connected with a first pixel circuit; the first pixel circuit includes a first drive transistor; each of the second pixels includes a second light-emitting element connected with a second pixel circuit; and the second pixel circuit includes a second drive transistor. The display panel further includes a display region, including an optical component region and a first display region, where the first light-emitting element is in the optical component region; the second light-emitting element is in the first display region. The first pixels include first blue pixels, first red pixels, and first green pixels; a width-to-length ratio of a first drive transistor corresponding to a first blue pixel is R1, a width-to-length ratio of a first drive transistor corresponding to a first red pixel is R2, and a width-to-length ratio of a first drive transistor corresponding to a first green pixel is R3. The second pixels include second blue pixels, second red pixels, and second green pixels; a width-to-length ratio of a second drive transistor corresponding to a second blue pixel is R1', a width-to-length ratio of a second drive transistor corresponding to a second red pixel is R2', and a width-to-length ratio of a second drive transistor corresponding to a second green pixel is R3', where R1>R1', R2>R2', and/or R3>R3'. the first pixel circuit includes a reset module, a data write module, and a light-emitting control module which are electrically connected to the first drive transistor. The reset module includes at least one reset transistor electrically connected to the first drive transistor; the data write module includes at least one data write transistor electrically connected to the first drive transistor; and the light-emitting control module includes at least one light-emitting control transistor electrically connected to the first drive transistor. A width-to-length ratio of a light-emitting control transistor corresponding to the first pixel circuit is greater than each of width-to-length ratios of the data write transistor in a same first pixel circuit.

Other aspects of the present disclosure can be understood by those skilled in the art in light of the description, the claims, and the drawings of the present disclosure.

BRIEF DESCRIPTION OF THE DRAWINGS

In order to more clearly explain the embodiments of the present disclosure or the technical solutions in the related technology, the drawings required for describing the embodiments or the related technology are briefly introduced hereinafter. Obviously, the drawings in the following description are merely embodiments of the present disclosure. Other drawings may also be obtained by those skilled in the art without any creative work according to provided drawings.

DETAILED DESCRIPTION

The technical solutions in the embodiments of the present disclosure are described clearly and completely in conjunction with the drawings in the embodiments of the present disclosure. Obviously, the described embodiments are merely a part of the embodiments of the present disclosure, but not all the embodiments.

As mentioned in the background, in addition to information display functions, appearance requirements of display panels have gradually increased in recent years. Larger screen-to-body ratio is the future market trend. Display panels with under-screen camera structures are favored by consumers. In the display panel with an under-screen camera structure, a camera is disposed under the display region of the display panel, and light passes through the display region of the display panel and is incident on the camera, thereby capturing pictures by the camera. However, disposing the under-screen camera structure in the display panel may worsen the display effect of the display panel.

The embodiments of the present disclosure provide a display panel and a display device, which may effectively solve the technical problems in the related technology and improve the chromaticity uniformity of the display panel at an optical component region, thereby improving the display effect of the display panel.

In order to achieve the above-mentioned objectives, the technical solutions provided by the embodiments of the present disclosure are described in detail with reference to FIGS. 1 to 11.

Figure 1:
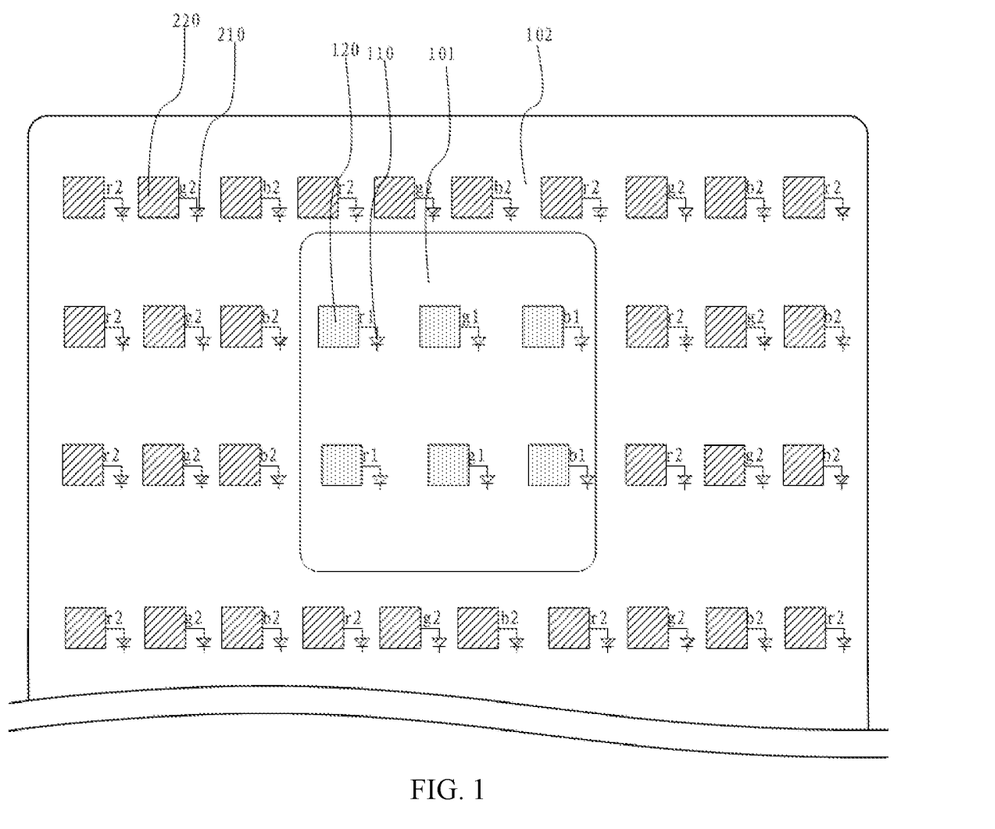
FIG. 1 illustrates a structural schematic of a display panel according to an embodiment of the present disclosure.
Figure 2:
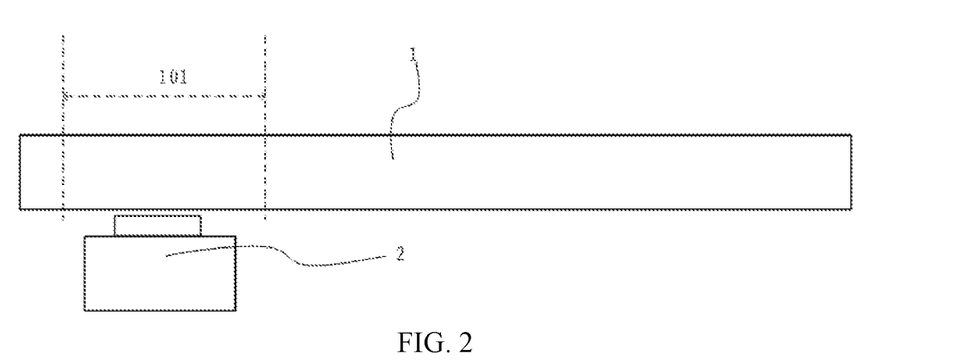
FIG. 2 illustrates a structural schematic of a display device according to an embodiment of the present disclosure.

FIG. 1 illustrates a structural schematic of a display panel according to an embodiment of the present disclosure. The display panel provided by the embodiments of the present disclosure may include a plurality of pixels, including first pixels and second pixels. The first pixel may include a first light-emitting element 110 and a first pixel circuit 120, connected to each other; and the first pixel circuit 120 may include a first drive transistor. The second pixel may include a second light-emitting element 210 and a second pixel circuit 220, connected to each other; and the second pixel circuit 220 may include a second drive transistor.

The display panel may further include a display region, including an optical component region 101 and a regular display region 102. The first light-emitting element 110 may be in the optical component region 101, and the second light-emitting element 210 may be in the regular display region 102. The density of the light-emitting element in the optical component region 101 may be less than the density of the light-emitting element in the regular display region 102.

The first pixels may include first blue pixels b1, first red pixels r1, and first green pixels g1. The width-to-length ratio of the first drive transistor corresponding to the first blue pixel b1 is R1, the width-to-length ratio of the first drive transistor corresponding to the red pixel r1 is R2, and the width-to-length ratio of the first drive transistor corresponding to the first green pixel g1 is R3, where R1>R2>0 and/or R1>R3>0.

It should be noted that optical components, such as a camera and the like, may be disposed at the optical component region provided by the embodiments of the present disclosure, which may not be limited according to the embodiments of the present disclosure and may be designed based on actual applications. As the structural schematic of the display device shown in FIG. 2, the display device may include a display panel 1 and an optical device 2. The display panel 1 may include the optical component region 101. The optical device 2 may be disposed at the non-light-exiting side of the display panel 1 and correspondingly disposed at the optical component region 101. Optionally, the optical device 2 may be a camera.

It should be understood that the display region of the display panel provided by the embodiments of the present disclosure may include the optical component region and the regular display region, and the optical component region and the regular display region may both include light-emitting elements, which may make the area of the display region larger to meet the trend of full-screen display. Moreover, at the optical component region provided by the embodiments of the present disclosure, the width-to-length ratio of the first drive transistor corresponding to the first blue pixel may be greater than the width-to-length ratio of the first drive transistor corresponding to the first red pixel, and/or the width-to-length ratio of the first drive transistor corresponding to the first blue pixel may be greater than the width-to-length ratio of the first drive transistor corresponding to the first green pixel. That is, at the optical component region provided by the embodiments of the present disclosure, the width-to-length ratio of the first drive transistor corresponding to the first blue pixel may be greater than the width-to-length ratio of the first drive transistor corresponding to the first red pixel; or, at the optical component region provided by the embodiments of the present disclosure, the width-to-length ratio of the first drive transistor corresponding to the first blue pixel may be greater than the width-to-length ratio of the first drive transistor corresponding to the first green pixel; or at the optical component region provided by the embodiments of the present disclosure, the width-to-length ratio of the first drive transistor corresponding to the first blue pixel may be greater than the width-to-length ratio of the first drive transistor corresponding to the first red pixel, and the width-to-length ratio of the first drive transistor corresponding to the first blue pixel may greater than the width-to-length ratio of the first drive transistor corresponding to the first green pixel. Furthermore, by using the manner of increasing the width-to-length ratio of the first drive transistor corresponding to the first blue pixel, the luminous efficiency of the first blue pixel may be improved, thereby achieving the purpose of improving the chromaticity uniformity of the display panel at the optical component region and further improving the display effect of the display panel.

For example, the calculation formula of the saturation region current I of a transistor is:

$$I=(\tfrac{1}{2})Un*Cox*(W/L)*(|Vgs|-|Vth|)2;$$

where Un is the electron mobility of the transistor channel, Cox is the capacitance of the gate oxide layer per unit area of the transistor, W/L is the channel width-to-length ratio of the transistor, Vgs is the gate/source voltage of the transistor, and Vth is the threshold voltage of the transistor. According to the calculation formula of the saturation region current I of the transistor, it may be seen that increasing the width-to-length ratio W/L of the transistor may increase the saturation region current I of the transistor and further improve the luminous efficiency of the light-emitting element electrically connected to the transistor. The test data of the transistor is shown in the following Table 1.

TABLE 1

| W/L width-to-length ratio (unit of the channel width and length, um) | Current I | Working region |
| --- | --- | --- |
| 3/30 | 74 nA | Saturation region |
| 12/22 | 298 nA | Saturation region |
| 17/13 | 299 nA | Saturation region |

It may be seen from Table 1 that when the width-to-length ratio of the transistor is larger, the current is larger when working in the saturation region. The test data of the color shift value of different display pictures of the display panel is shown in the following Table 2. As shown in Table 2, in a control 1, the width-to-length ratios of the drive transistors corresponding to the blue pixel, the red pixel, and the green pixel in Table 2 is 3 μm/19.435 μm; and in a control 2, the width-to-length ratios of the drive transistors corresponding to the red pixel and the green pixel is 3 μm/19.435 μm, and the width-to-length ratio of the drive transistor corresponding to the blue pixel is 3 μm/12 μm.

TABLE 2

| Display picture | Color shift value of control 1 | Color shift value of control 2 |
| --- | --- | --- |
| 32 grayscale white picture | 0.0110 | 0.00091 |
| 64 grayscale white picture | 0.0089 | 0.00067 |
| 127 grayscale white picture | 0.0075 | 0.00053 |
| 255 grayscale white picture | 0.0067 | 0.00051 |
| 255 grayscale white picture | 0.0049 | 0.00015 |
| 255 grayscale white picture | 0.0034 | 0.00014 |
| 255 grayscale white picture | 0.0056 | 0.00022 |

It may be seen from Table 2 that when the width-to-length ratio of the drive transistor corresponding to the blue pixel is larger, the color shift value of the picture displayed by the display panel may decrease. Therefore, it may be known that, by combining the experimental data in Table 1 and Table 2, the luminous efficiency of the first light-emitting element corresponding to the first blue pixel may be improved on the basis of increasing the width-to-length ratio of the first drive transistor corresponding to the first blue pixel in the embodiments of the present disclosure. In addition, on the basis of improving the luminous efficiency of the first light-emitting element corresponding to the first blue pixel, the objective of improving the chromaticity uniformity of the display panel at the optical component region may be achieved, thereby improving the display effect of the display panel.

In one embodiment of the present disclosure, 2≤R1/R3≤4, 2≤R1/R3≤4 is provided by the present disclosure. That is, any ratio of the width-to-length ratios between the width-to-length ratio R1 of the first drive transistor corresponding to the first blue pixel and each of the width-to-length ratio R2 of the first drive transistor corresponding to the first red pixel and the width-to-length ratio R3 of the drive transistor corresponding to the first green pixel may not be less than 2 and not be more than 4 according to the embodiments of the present disclosure. Moreover, according to the embodiments of the present disclosure, the channel width of the first drive transistor corresponding to the first red pixel is W2, the channel width of the first drive transistor corresponding to the first green pixel is W3, the channel length of the first drive transistor corresponding to the first red pixel is L2, and the channel length of the first drive transistor corresponding to the first green pixel is L3, where |W2−W3|≤0.5 μm, |L2−L3|≤0.5 μm. By optimizing the ratio limitation of the width-to-length ratios and the size limitation of the first drive transistors respectively corresponding to the first blue pixel, the first red pixel, and the first green pixel, it may ensure high chromaticity uniformity of the display panel at the optical component region.

Figure 3:
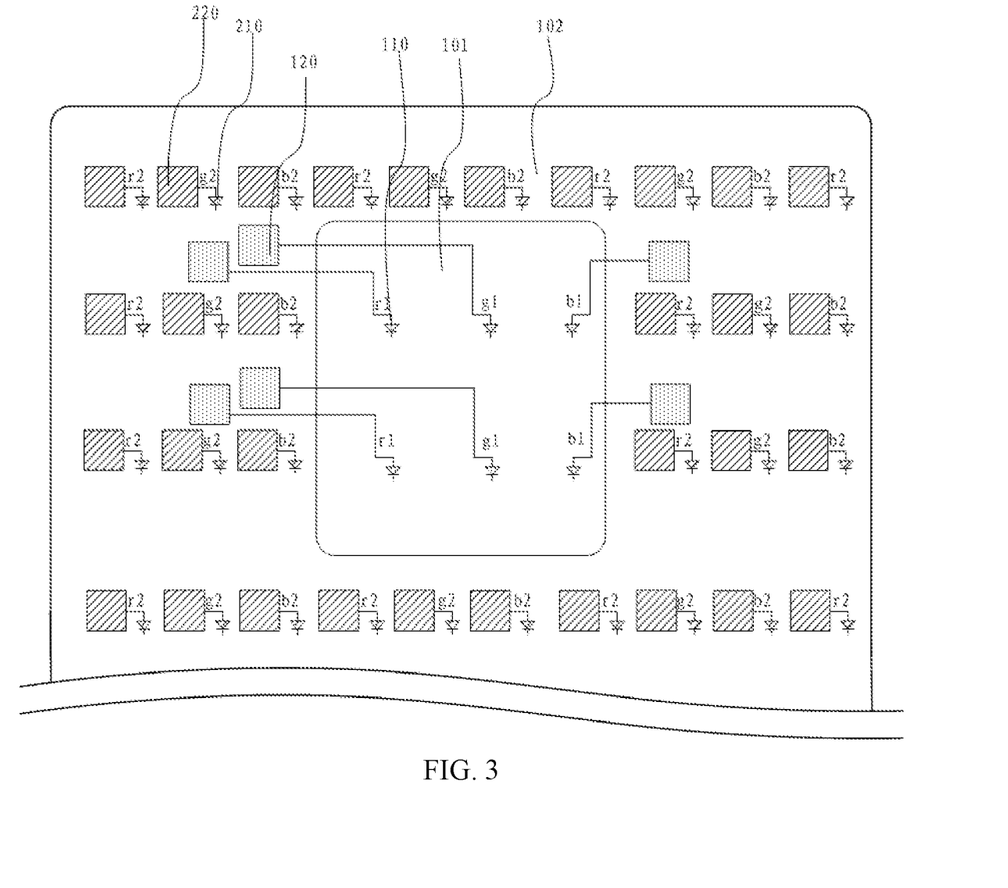
FIG. 3 illustrates a structural schematic of another display panel according to an embodiment of the present disclosure.

As shown in FIG. 1, the first light-emitting element 110 and the first pixel circuit 120 provided by the embodiments of the present disclosure may be both disposed at the optical component region 101. Or, the first light-emitting element provided by the embodiments of the present disclosure may be disposed in the optical component region, and the first pixel circuit connected to the first light-emitting element may be disposed in the regular display region. Referring to FIG. 3, the display panel provided by the embodiments of the present disclosure may include the display region. The display area may include the optical component region 101 and the regular display region 102. The first light-emitting element 110 may be located in the optical component region 101. However, the first pixel circuit 120 connected to the first light-emitting element 110 may be located outside the optical component region 101, which may further increase the light-transmitting area of the optical component region and ensure high effect of the elements of the display panel disposed at the optical component region. Optionally, the first pixel circuit 120 connected to the first light-emitting element 110 may be located between the regular display region 102 and the optical component region 101.

Figure 4:
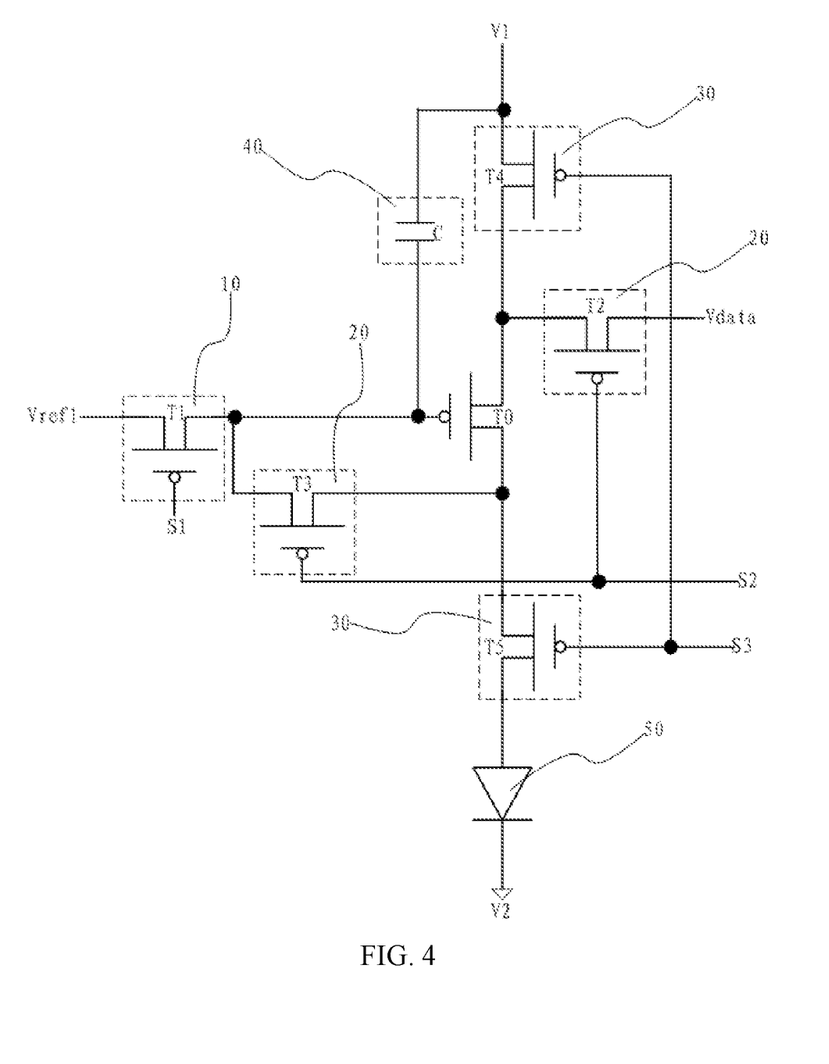
FIG. 4 illustrates a structural schematic of a pixel circuit according to an embodiment of the present disclosure.

The pixel drive circuit provided by the embodiments of the present disclosure may be electrically connected to the light-emitting element (e.g., the first pixel drive circuit may be electrically connected to the first light-emitting element, and the second pixel drive circuit may be electrically connected to the second light-emitting element). In addition to including the drive transistor, the pixel drive circuit may also include a plurality of other transistors and capacitors. All of the transistors and capacitors may cooperate with each other to provide a drive current to the light-emitting element, and then the light-emitting element may emit light in response to the drive current. The circuit composition of the first pixel drive circuit and the second pixel drive circuit provided by the embodiments of the present disclosure may be same. FIG. 4 illustrates a structural schematic of a pixel circuit according to an embodiment of the present disclosure. The pixel drive circuit may include a drive transistor T0, and a reset module 10, a data write module 20, a light-emitting control module 30 and a storage module 40 which are electrically connected to the drive transistor T0. The reset module 10 may be configured to transmit a first reference voltage Vref1 to the gate electrode of the drive transistor T0 to reset the gate electrode potential of the drive transistor T0; the data write module 20 may be configured to write the data voltage Vdata into the first terminal of the drive transistor T0; the light-emitting control module 30 may be configured to transmit the drive current generated by the drive transistor T0 to the light-emitting element 50, which makes the light-emitting element 50 emit light in response to the drive current; and the storage module 40 may be configured to maintain the voltage at the gate electrode of the drive transistor T0. Optionally, the display panel provided by the embodiments of the present disclosure may be an organic light-emitting display panel. Optionally, the transistors provided in the embodiments of the present disclosure may all be thin-film transistors.

As shown in FIG. 4, the reset module 10 provided by the embodiments of the present disclosure may include a reset transistor T1. The first terminal of the reset transistor T1 may be connected to the first reference voltage Vref1, the gate electrode of the reset transistor T1 may be electrically connected to a first control signal S1, and the second terminal of the reset transistor T1 may be electrically connected to the gate electrode of the drive transistor T0. The data write module 20 may include a first data write transistor T2 and a second data write transistor T3. The gate electrodes of the first data write transistor T2 and the second data write transistor T3 may both be electrically connected to a second control signal S2. The first terminal of the first data write transistor T2 may be connected to the data voltage Vdata, and the second terminal of the first data write transistor T2 may be electrically connected to the first terminal of the drive transistor T0. The first terminal of the second data write transistor T3 may be electrically connected to the gate electrode of the drive transistor T0, and the second terminal of the second data write transistor T3 may be electrically connected to the second terminal of the drive transistor T0. The light-emitting control module 30 may include a first light-emitting control transistor T4 and a second light-emitting control transistor T5. The gate electrodes of the first light-emitting control transistor T4 and the second light-emitting control transistor T5 may both be electrically connected to a third control signal S3. The first terminal of the first light-emitting control transistor T4 may be connected to a first voltage V1, and the second terminal of the first light-emitting control transistor T4 may be electrically connected to the first terminal of the drive transistor T0. The first terminal of the second light-emitting control transistor T5 may be electrically connected to the second terminal of the drive transistor T0, the second terminal of the second light-emitting control transistor T5 may be electrically connected to the first terminal of the light-emitting element 50, and the second terminal of the light-emitting element 50 may be connected to a second voltage V2. The storage module 40 may include a storage capacitor C, the first terminal of the storage capacitor C may be connected to the first voltage V1, and the second terminal of the storage capacitor C may be electrically connected to the gate electrode of the drive transistor T0.

Figure 5:
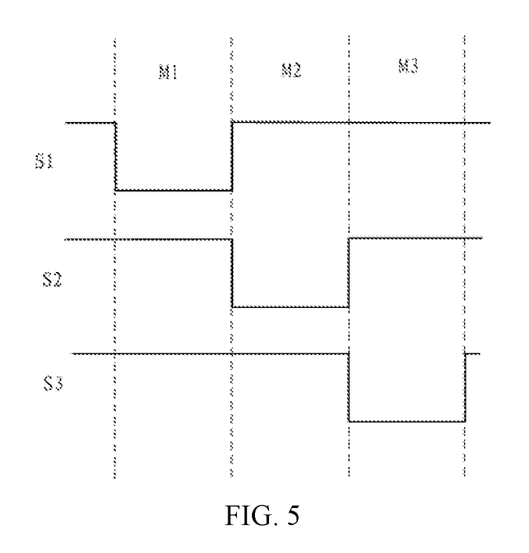
FIG. 5 illustrates a time sequence diagram according to an embodiment of the present disclosure.

As shown in FIGS. 4-5, FIG. 5 illustrates a time sequence diagram according to an embodiment of the present disclosure. In the embodiments of the present disclosure, all transistors of the pixel circuits are P-type as an example for description (e.g., the transistor is in conduction when the control signal connected to the gate electrode of the transistor is a low level, and the transistor is cutoff when the control signal connected to the gate electrode of the transistor is a high level). The working process of the pixel drive circuit provided by the embodiments of the present disclosure may include a reset stage M1, a data write stage M2, and a light-emitting stage M3, which are sequentially performed.

At the reset stage M1, the reset transistor T1 is in conduction to transmit the first reference voltage Vref1 to the gate electrode of the drive transistor T0. At this point, the transistors of the data write module 20 and the light-emitting control module 30 may both be cutoff. The first reference voltage Vref1 may be a voltage capable of controlling the conduction of the drive transistor T0.

At the data write stage M2, the transistor of the light-emitting control module 30 and the reset transistor T1 may both be cutoff, and the first data write transistor T2 and the second data write transistor T3 may be in conduction. The first data write transistor T2 may output the data voltage Vdata to the first terminal of the drive transistor T0, and the second data write transistor T3 may connect the gate electrode with the second terminal of the drive transistor T0.

At the light-emitting stage M3, the transistor of the data write module 20 and the reset transistor T1 may both be cutoff, and the first light-emitting control transistor T4 and the second light-emitting control transistor T5 may be in conduction. In such way, the path for the first voltage V1, the first light-emitting control transistor T4, the drive transistor T0, the second light-emitting control transistor T5, the light-emitting element 50, and the second voltage V2 may be formed; the drive current generated by the drive transistor T0 may be transmitted to the light-emitting element 50; and the light-emitting element 50 may emit light in response to the drive current.

Figure 6:
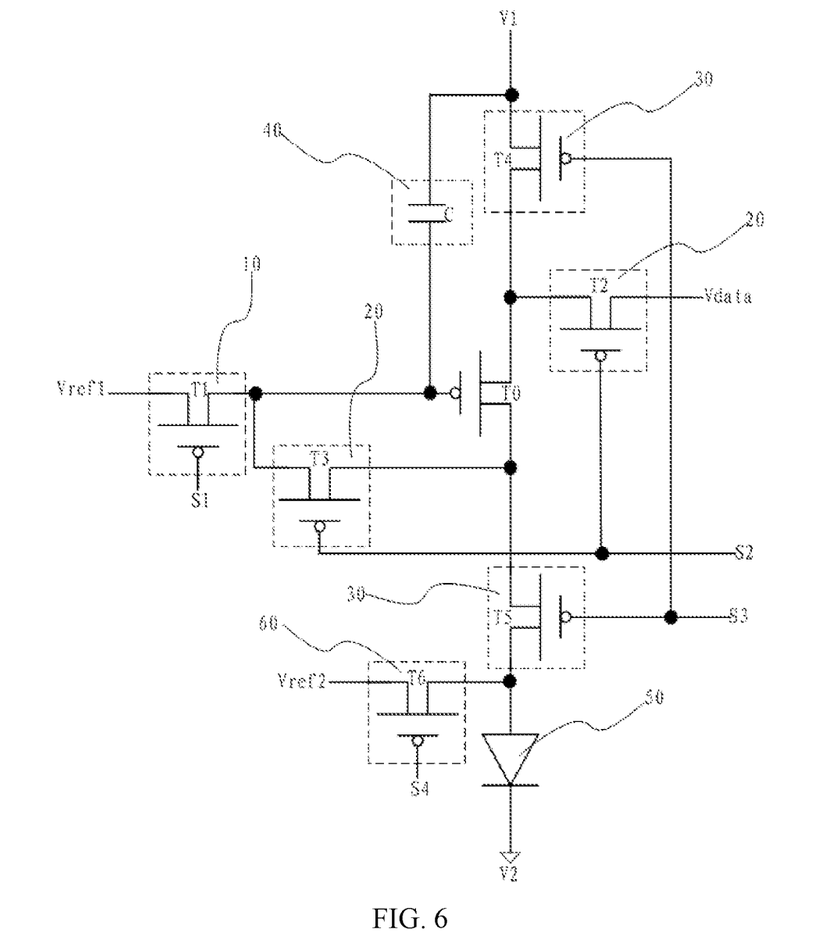
FIG. 6 illustrates a structural schematic of another pixel circuit according to an embodiment of the present disclosure.
Figure 7:
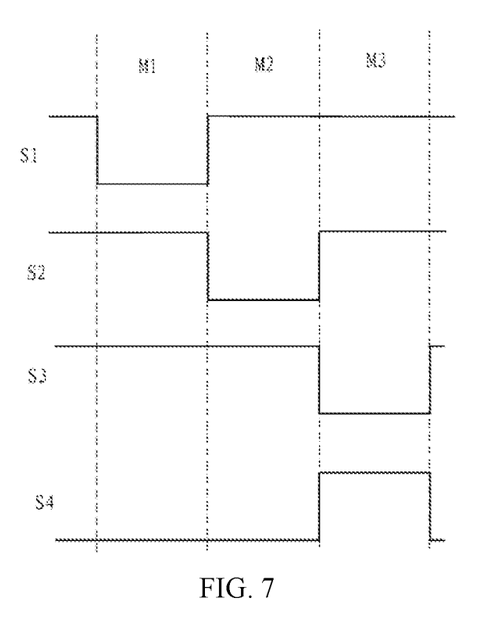
FIG. 7 illustrates another time sequence diagram according to an embodiment of the present disclosure.

Furthermore, the pixel circuit provided by the embodiments of the present disclosure may further include a black state maintaining module. FIG. 6 illustrates a structural schematic of another pixel circuit according to an embodiment of the present disclosure. The pixel circuit may further include a black state maintaining module 60 electrically connected to the light-emitting element. The black state maintaining module 60 may be configured to transmit the second reference voltage Vref2 to the light-emitting element 50, thereby controlling the light-emitting element 50 outside the light-emitting stage to maintain the black state to be off. For example, as shown in FIG. 6, the black state maintaining module 60 provided by the embodiments of the present disclosure may include a black state maintaining transistor T6. The gate electrode of the black state maintaining transistor T6 may be electrically connected to a fourth control signal S4, the first terminal of the black state maintaining transistor T6 may be connected to the second reference signal Vref2, and the second terminal of the black state maintaining transistor T6 may be electrically connected to the first terminal of the light-emitting element 50. The pixel circuit shown in FIG. 6 of the present disclosure may include the reset stage M1, the data write stage M2, and the light-emitting stage M3 which are same as the pixel circuit shown in FIG. 4. FIG. 7 illustrates another time sequence diagram according to an embodiment of the present disclosure. At the reset stage M1 and the data write stage M2, the black state maintaining transistor T6 may be controlled to be in conduction by the fourth control signal S4; furthermore, the black state maintaining transistor T6 may transmit the second reference voltage Vref2 to the first terminal of the light-emitting element 50, thereby controlling the light-emitting element 50 to maintain the black state to be off, which may avoid the black state to be not dark at the reset stage and the data write stage. At the light-emitting stage M3, the black state maintaining transistor T6 may be controlled to be cutoff by the fourth control signal S4, thereby ensuring the light-emitting element 50 to emit light normally.

It should be noted that the circuit connection structure of the above-mentioned pixel circuit may not be limited in the embodiments of the present disclosure, and other circuit connection structures may also be used in other embodiments of the present disclosure. The drive transistor, the reset transistor, the data write transistor, the light-emitting control transistor, and the black state maintaining transistor provided by the embodiments of the present disclosure may all be P-type thin-film transistors; or the drive transistor, the reset transistor, the data write transistor, the light-emitting control transistor, and the black state maintaining transistor provided by the embodiments of the present disclosure may all be N-type thin-film transistors; the first voltage provided by the embodiments of the present disclosure may be the voltage provided by the anode voltage terminal, and the second voltage may be the voltage provided by the cathode voltage terminal; and the light-emitting element may be a light-emitting diode, and the like, which not be limited according to an embodiment of the present disclosure.

Furthermore, the configuration of the transistors, storage capacitors and the like in the first pixel circuit and/or the second pixel circuit may be further optimized to improve the performance of the pixel circuit and the display effect of the display panel. For example, the first pixel circuit provided by the embodiments of the present disclosure may include the reset module, the data write module, and the light-emitting control module which are electrically connected to the first drive transistor. The reset module may include at least one reset transistor electrically connected to the first drive transistor. The data write module may include at least one data write transistor electrically connected to the first drive transistor. The light-emitting control module may include at least one light-emitting control transistor electrically connected to the first drive transistor. The width-to-length ratio of the light-emitting control transistor corresponding to the first pixel circuit provided in the embodiments of the present disclosure may be greater than each of width-to-length ratios of the reset transistor and the data write transistor in a same first pixel circuit.

Moreover, the first pixel circuit provided by the embodiments of the present disclosure may further include the black state maintaining module electrically connected to the first light-emitting element. The black state maintaining module may include at least one black state maintaining transistor electrically connected to the first light-emitting element. The width-to-length ratio of the light-emitting control transistor corresponding to the first pixel circuit may be greater than the width-to-length ratio of the black state maintaining transistor in a same first pixel circuit.

It should be understood that the light-emitting control module provided by the embodiments of the present disclosure may be configured to control the drive current generated by the first drive transistor to be transmitted to the first light-emitting element; furthermore, the light-emitting device may emit light in response to the drive current. The light-emitting control transistor of the light-emitting control module may be connected in series with the first drive transistor, such that the current transmitted by the light-emitting control transistor may be relatively large. In the embodiments of the present disclosure, by setting the width-to-length ratio of the light-emitting control transistor in the first pixel circuit to be larger than the width-to-length ratios of the reset transistor, the data write transistor and the black state maintaining transistor in the first pixel circuit, the stability of the light-emitting control transistor and the first pixel circuit may be improved. Optionally, the width-to-length ratio of the light-emitting control transistor corresponding to the first pixel circuit provided by the embodiments of the present disclosure may be $R_k$, where $4 \leq R_k \leq 6$.

In one embodiment of the present disclosure, the width-to-length ratio of the light-emitting control transistor corresponding to the first blue pixel provided by the embodiments of the present disclosure may be $R_k1$; the width-to-length ratio of the light-emitting control transistor corresponding to the first red pixel provided by the embodiments of the present disclosure may be $R_k2$; and the width-to-length ratio of the light-emitting control transistor corresponding to the first green pixel provided by the embodiments of the present disclosure may be $R_k1$. When $R1>R2>0$, $R_k1>R_k2>0$; and when $R1>R3>0$, $R_k1>R_k3>0$.

It should be understood that, according to the embodiments of the present disclosure, the width-to-length ratio of the first drive transistor corresponding to the first blue pixel may be greater than the width-to-length ratio of the first drive transistor corresponding to the first red pixel, and/or the width-to-length ratio of the first drive transistor corresponding to the first blue pixel may be greater than the width-to-length ratio of the first drive transistor corresponding to the first green pixel. Furthermore, when the width-to-length ratio of the first drive transistor corresponding to the first blue pixel is greater than the width-to-length ratio of the first drive transistor corresponding to the first red pixel, the width-to-length ratio of the light-emitting control transistor corresponding to the first blue pixel may be set to be larger than the width-to-length ratio of the light-emitting control transistor corresponding to the first red pixel; and when the width-to-length ratio of the first drive transistor corresponding to the first blue pixel is greater than the width-to-length ratio of the first drive transistor corresponding to the first green pixel, the width-to-length ratio of the light-emitting control transistor corresponding to the first blue pixel may be set to be larger than the width-to-length ratio of the light-emitting control transistor corresponding to the first green pixel, which may enable the light-emitting control transistor corresponding to the first blue pixel to transmit a larger current and further improve the stability of the first pixel circuit corresponding to the first blue pixel.

In one embodiment of the present disclosure, the first pixel circuit provided by the present disclosure may include a first storage capacitor electrically connected to the gate electrode of the first drive transistor; the second pixel circuit may include a second storage capacitor electrically connected to the gate electrode of the second drive transistor; and the capacitance of the first storage capacitor may be greater than the capacitance of the second storage capacitor.

It should be understood that the light-emitting element density at the regular display region provided by the embodiments of the present disclosure may be greater than the light-emitting element density at the optical component region. In order to improve the display brightness at the optical component region, it is necessary to increase the drive current generated by the first drive transistor, and the objective of improving the luminous efficiency of the first light-emitting element may be achieved by increasing the drive current. That is, under the condition of a same grayscale and a same color pixel, the ratio of the drive current of the first light-emitting element to the drive current of the second light-emitting element may be the ratio of the light-emitting element density at the regular display region to the light-emitting element density at the optical component region. Furthermore, the capacitance of the first storage capacitor provided by the embodiments of the present disclosure is set to be larger than the capacitance of the second storage capacitor, which may ensure that the first storage capacitor has a high potential maintaining capacity for the gate electrode of the first drive transistor, and further ensure high stability of the first pixel circuit on the basis of ensuring high uniformity of the overall brightness of the display panel. Optionally, according to the embodiments of the present disclosure, the capacitance of the first storage capacitor is C1, and the capacitance of the second storage capacitor is C2, where $2 \leq C1/C2 \leq 4$.

In one embodiment of the present disclosure, as shown in FIG. 1, the second pixels provided by the present disclosure may include second blue pixels b2, second red pixels r2, and second green pixels g2. The width-to-length ratio of the second drive transistor corresponding to the second blue pixel b2 is R1', the width-to-length ratio of the second drive transistor corresponding to the second red pixel r2 is R2', and the width-to-length ratio of the second drive transistor corresponding to the second green pixel is R3', where R1'>R2'>0 and/or R1'>R3'>0.

It should be understood that in the regular display region provided by the embodiments of the present disclosure, the width-to-length ratio of the second drive transistor corresponding to the second blue pixel may be greater than the width-to-length ratio of the second drive transistor corresponding to the second red pixel, and/or the width-to-length ratio of the second drive transistor corresponding to the second blue pixel may be greater than the width-to-length ratio of the second drive transistor corresponding to the second green pixel. That is, in the regular display region provided by the embodiments of the present disclosure, the width-to-length ratio of the second drive transistor corresponding to the second blue pixel may be greater than the width-to-length ratio of the second drive transistor corresponding to the second red pixel; or in the regular display region provided by the embodiments of the present disclosure, the width-to-length ratio of the second drive transistor corresponding to the second blue pixel may be greater than the width-to-length ratio of the second drive transistor corresponding to the second green pixel; or in the regular display region provided by the embodiments of the present disclosure, the width-to-length ratio of the second drive transistor corresponding to the second blue pixel may be greater than the width-to-length ratio of the second drive transistor corresponding to the second red pixel, and the width-to-length ratio of the second drive transistor corresponding to the second blue pixel may be greater than the width-to-length ratio of the second drive transistor corresponding to the second green pixel. Furthermore, by increasing the width-to-length ratio of the second drive transistor corresponding to the second blue pixel, the luminous efficiency of the second blue pixel may be improved, and the objective of improving the chromaticity uniformity of the display panel in the regular display region may be achieved, which may ensure high chromaticity uniformity of the display panel in the regular display region and the optical component region and further improve the display effect of the display panel. Optionally, according to the embodiments of the present disclosure, the channel width of the second drive transistor corresponding to the second red pixel is W2', the channel width of the second drive transistor corresponding to the second green pixel is W3', the channel length of the second drive transistor corresponding to the second red pixel is L2', and the channel length of the second drive transistor corresponding to the second green pixel is L3', where $|W2'-W3'| \leq 0.5$ μm, and $|L2'-L3'| 0.5$ μm.

Further, when R1'>R2'>0, the width-to-length ratio of the light-emitting control transistor of the second blue pixel may be greater than the width-to-length ratio of the light-emitting control transistor of the second red pixel; and when R1'>R3'>0, the width-to-length ratio of the light-emitting control transistor of the second blue pixel may be greater than the width-to-length ratio of the light-emitting control transistor of the second green pixel.

In one embodiment of the present disclosure, the width-to-length ratio of the first drive transistor corresponding to the first blue pixel, provided by the embodiments of the present disclosure, may be greater than the width-to-length ratio of the second drive transistor corresponding to the second blue pixel; the width-to-length ratio of the first drive transistor corresponding to the first red pixel may be greater than the width-to-length ratio of the second drive transistor corresponding to the second red pixel; and the width-to-length ratio of the first drive transistor corresponding to the first green pixel may be greater than the width-to-length ratio of the second drive transistor corresponding to the second green pixel, where R1>R1', R2>R2', and R3>R3'.

Furthermore, the width-to-length ratio of the light-emitting control transistor corresponding to the first blue pixel may be greater than the width-to-length ratio of the light-emitting control transistor corresponding to the second blue pixel; the width-to-length ratio of the light-emitting control transistor corresponding to the first red pixel may be greater than the width-to-length ratio of the light-emitting control transistor corresponding to the second red pixel; and the width-to-length ratio of the light-emitting control transistor corresponding to the first green pixel may be greater than the width-to-length ratio of the light-emitting control transistor corresponding to the second green pixel, thereby improving the stability of the first pixel circuit.

It should be understood that, in the embodiments of the present disclosure, the width-to-length ratio of the first drive transistor corresponding to any color pixel is set to be larger than the width-to-length ratio of the second drive transistor corresponding to the same color pixel to increase the drive current generated by the first drive transistor; furthermore, the luminous efficiency of the first light-emitting element corresponding to the first pixel may be improved, the overall display brightness at the optical component region of the display panel may be improved, and the objective of improving the overall display brightness of the display panel with high uniformity may be achieved. Optionally, the ratio of the width-to-length ratio of the first drive transistor corresponding to any color pixel to the width-to-length ratio of the second drive transistor corresponding to the same color pixel is S, where $3.5 \leq S \leq 5$.

Figure 8:
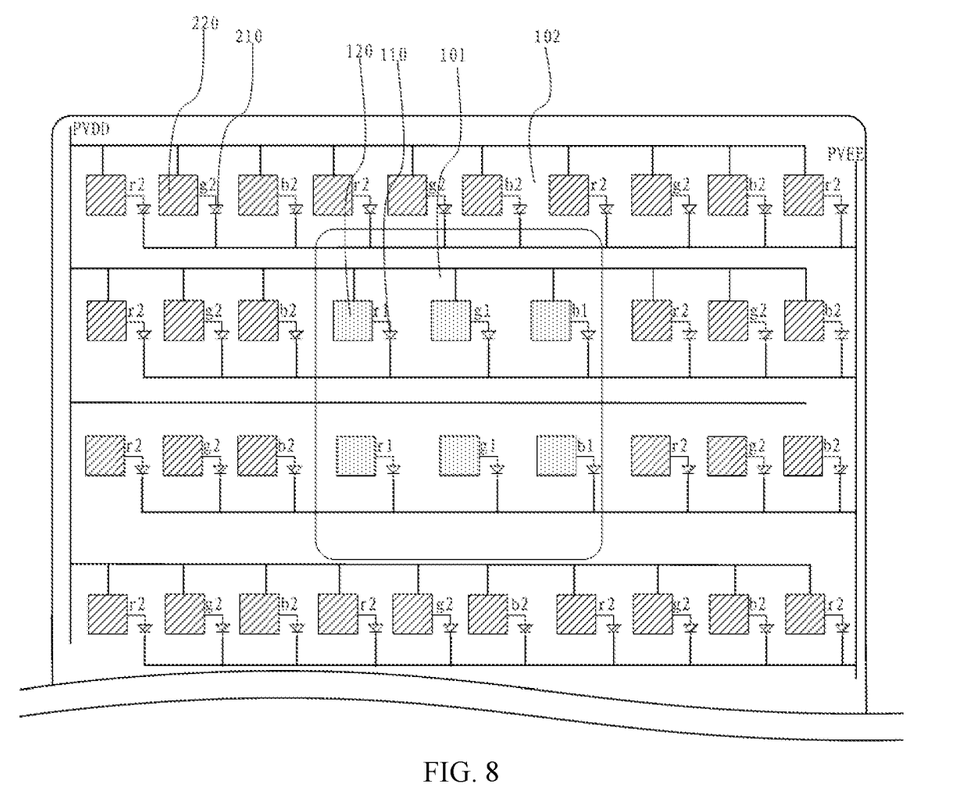
FIG. 8 illustrates a structural schematic of another display panel according to an embodiment of the present disclosure.

Furthermore, the width-to-length ratio of the first drive transistor corresponding to any color pixel provided by the embodiments of the present disclosure may be greater than the width-to-length ratio of the second drive transistor corresponding to the same color pixel, such that an expected drive current may be generated by applying a small cross voltage to the first drive transistor. Therefore, the first pixel circuit and the second pixel circuit provided by the embodiments of the present disclosure may be connected to a same voltage terminal, which reduces the power consumption of the first pixel circuit while reducing the wiring difficulty of the display panel. FIG. 8 illustrates a structural schematic of another display panel according to an embodiment of the present disclosure. Any one of the first pixel circuit 120 and the second pixel circuit 220 provided by the embodiments of the present disclosure may include an anode voltage terminal and a cathode voltage terminal. The anode voltage terminal of the first pixel circuit 120 and the anode voltage terminal of the second pixel circuit 220 may both be electrically connected to a same voltage terminal PVDD; and the cathode voltage terminal of the first pixel circuit 120 and the cathode voltage terminal of the second pixel circuit 220 may both be electrically connected to a same voltage terminal PVEE.

Figure 9:
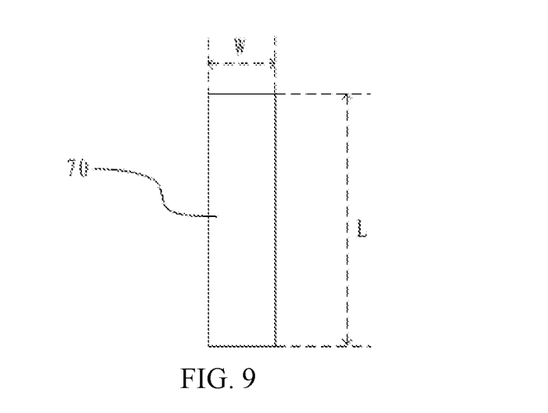
FIG. 9 illustrates a structural schematic of a transistor channel according to an embodiment of the present disclosure.

FIG. 9 illustrates a structural schematic of a transistor channel according to an embodiment of the present disclosure. In the first drive transistor corresponding to the first blue pixel, the first drive transistor corresponding to the first red pixel, and the first drive transistor corresponding to the first green pixel, at least a channel 70 of the first drive transistor corresponding to the first blue pixel may have a rectangular shape, and an expected ratio may be achieved by optimizing the width W and the length L of the channel 70.

Figure 10:
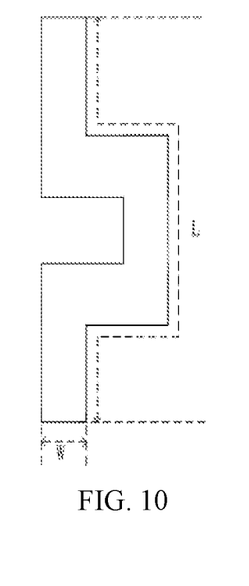
FIG. 10 illustrates a structural schematic of another transistor channel according to an embodiment of the present disclosure.

It should be understood that, when the width-to-length ratio of one transistor provided by the above-mentioned embodiments of the present disclosure may be greater than the width-to-length ratio of another transistor, (e.g., the width-to-length ratio of the first drive transistor of the first blue pixel may be greater than each of the width-to-length ratio of the first drive transistor of the first red pixel and the width-to-length ratio of the first drive transistor of the first green pixel; the width-to-length ratio of the second drive transistor of the second blue pixel may be greater than each of the width-to-length ratio of the second drive transistor of the second red pixel and the width-to-length ratio of the second drive transistor of the second green pixel; the width-to-length ratio of the first drive transistor of the first blue pixel may be greater than the width-to-length ratio of the second drive transistor of the second blue pixel, the width-to-length ratio of the first drive transistor of the first red pixel may be greater than the width-to-length ratio of the second drive transistor of the second red pixel, the width-to-length ratio of the first drive transistor of the first green pixel may be greater than the width-to-length ratio of the second drive transistor of the second green pixel, and the like), the channel shapes may be modified to achieve the objective of changing the width-to-length ratios of the transistors. For example, a transistor with a relatively large width-to-length ratio may be fabricated with a rectangular channel as shown in FIG. 9, while a transistor with a relatively small width-to-length ratio may be fabricated with a bent channel (e.g., zigzag shape) as shown in FIG. 10. On the basis of a same channel width W, compared with the rectangular channel, the length L of the bent channel may be greater than the length L of the rectangular channel.

Or, on the basis of the same transistor channel shape, in the embodiments of the present disclosure, a manner of increasing the channel width and reducing the channel length may be used, or a manner of maintaining the channel width constant while reducing the channel length may be used, or a manner of increasing the channel width and maintaining the channel length constant may be used, thereby achieving the objective of increasing the width-to-length ratios of the transistor, which may not be limited according to an embodiment of the present disclosure.

Correspondingly, the present disclosure further provides a display device. The display device provided by the embodiments of the present disclosure may include the display panel described in any one of the above-mentioned embodiments.

Figure 11:
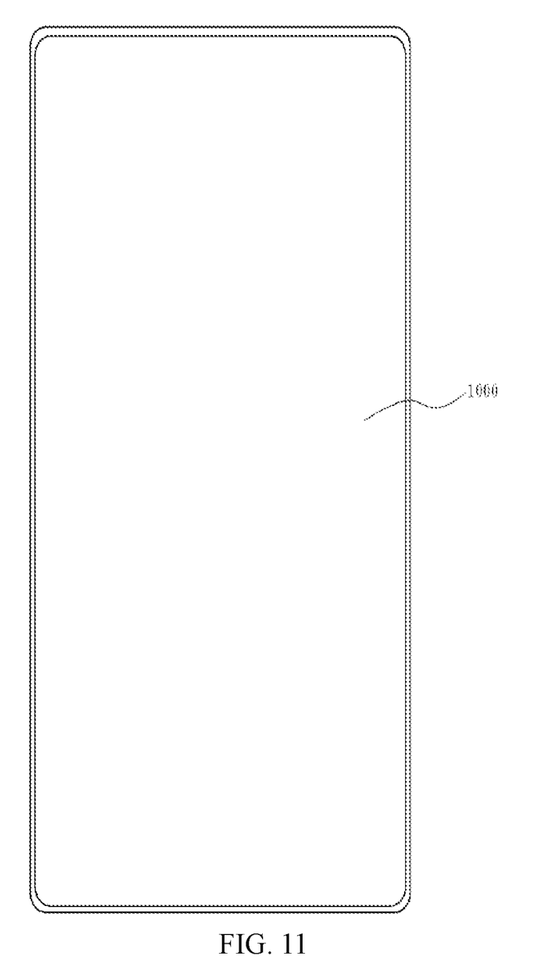
FIG. 11 illustrates a structural schematic of another display device according to an embodiment of the present disclosure.

FIG. 11 illustrates a structural schematic of a display device according to an embodiment of the present disclosure. The display device provided in the embodiments of the present disclosure may be a mobile terminal 1000, including the display panel provided in any one of the above-mentioned embodiments.

It should be noted that the display device provided in the embodiments of the present disclosure may also be a notebook, a tablet computer, a computer, a wearable device, and the like, which may not be limited according to an embodiment of the present disclosure.

From the above-mentioned embodiments, it can be seen that the display panel and the display device provided by the present disclosure may achieve at least the following beneficial effects.

The embodiments of present disclosure provide the display panel and the display device. The display region of the display panel may include the optical component region and the regular display region; and the optical component region and the regular display region may both include light-emitting elements, which may make the area of the display region larger to meet the full-screen display trend. Moreover, at the optical component region provided by the embodiments of the present disclosure, the width-to-length ratio of the first drive transistor corresponding to the first blue pixel may be greater than the width-to-length ratio of the first drive transistor corresponding to the first red pixel, and/or the width-to-length ratio of the first drive transistor corresponding to the first blue pixel may be greater than the width-to-length ratio of the first drive transistor corresponding to the first green pixel, thereby improving the luminous efficiency of the first blue pixel, achieving the objective of improving the chromaticity uniformity of the display panel at the optical component region, and further improving the display effect of the display panel.

The above-mentioned description of the disclosed embodiments may enable those skilled in the art to implement or use the present disclosure. Various obvious modifications to the embodiments of the present disclosure may be made by those skilled in the art, and the general principles defined in the present disclosure may be implemented in other embodiments without departing from the spirit or scope of the present disclosure. Therefore, the present disclosure may not be limited to the embodiments of the present disclosure but should conform to the widest scope consistent with the principles and novel features disclosed in the present disclosure.

What is claimed is:

1. A display panel, comprising:
a plurality of pixels, including first pixels and second pixels, wherein each of the first pixels includes a first light-emitting element connected with a first pixel circuit; the first pixel circuit includes a first drive transistor; each of the second pixels includes a second light-emitting element connected with a second pixel circuit; and the second pixel circuit includes a second drive transistor; and
a display region, including an optical component region and a first display region, wherein the first light-emitting element is in the optical component region; and the second light-emitting element is in the first display region, wherein:
the first pixels include first blue pixels, first red pixels, and first green pixels; a width-to-length ratio of a first drive transistor corresponding to a first blue pixel is R1, a width-to-length ratio of a first drive transistor corresponding to a first red pixel is R2, and a width-to-length ratio of a first drive transistor corresponding to a first green pixel is R3,
the second pixels include second blue pixels, second red pixels, and second green pixels; a width-to-length ratio of a second drive transistor corresponding to a second blue pixel is R1', a width-to-length ratio of a second drive transistor corresponding to a second red pixel is R2', and a width-to-length ratio of a second drive transistor corresponding to a second green pixel is R3', wherein R1>R1', R2>R2', and/or R3>R3', and
the first pixel circuit includes a first storage capacitor electrically connected to a gate electrode of the first drive transistor; the second pixel circuit includes a second storage capacitor electrically connected to a gate electrode of the second drive transistor;
and a capacitance of the first storage capacitor is greater than a capacitance of the second storage capacitor.

2. The display panel according to claim 1, wherein:
a channel width of the first drive transistor corresponding to the first red pixel is W2, a channel width of the first drive transistor corresponding to the first green pixel is W3, a channel length of the first drive transistor corresponding to the first red pixel is L2, and a channel length of the first drive transistor corresponding to the first green pixel is L3, wherein |W2−W3|0.5 µm, and |L2−L3|0.5 µm.

3. The display panel according to claim 1, wherein:
the first pixel circuit includes a reset module, a data write module, and a light-emitting control module which are electrically connected to the first drive transistor; the reset module includes at least one reset transistor electrically connected to the first drive transistor; the data write module includes at least one data write transistor electrically connected to the first drive transistor; and the light-emitting control module includes at least one light-emitting control transistor electrically connected to the first drive transistor; and
a width-to-length ratio of a light-emitting control transistor corresponding to the first pixel circuit is greater than each of width-to-length ratios of the reset transistor and the data write transistor in a same first pixel circuit.

4. The display panel according to claim 3, wherein:
the first pixel circuit further includes a black state maintaining module electrically connected to the first light-emitting element, and the black state maintaining module includes at least one black state maintaining transistor electrically connected to the first light-emitting element; and
the width-to-length ratio of the light-emitting control transistor corresponding to the first pixel circuit is greater than a width-to-length ratio of the black state maintaining transistor in a same first pixel circuit.

5. The display panel according to claim 3, wherein:
the width-to-length ratio of the light-emitting control transistor corresponding to the first pixel circuit is $R_k$, wherein $4 \leq R_k \leq 6$.

6. The display panel according to claim 1, wherein:
the capacitance of the first storage capacitor is C1, and the capacitance of the second storage capacitor is C2, wherein $2 \leq C1/C2 \leq 4$.

7. The display panel according to claim 1, wherein:
in the first drive transistor corresponding to the first blue pixel, the first drive transistor corresponding to the first red pixel, the first drive transistor corresponding to the first green pixel, at least the first drive transistor corresponding to the first blue pixel has a channel in a rectangular shape.

8. A display device with the display panel according to claim 1.

9. A display panel, comprising:
a plurality of pixels, including first pixels and second pixels, wherein each of the first pixels includes a first light-emitting element connected with a first pixel circuit; the first pixel circuit includes a first drive transistor; each of the second pixels includes a second light-emitting element connected with a second pixel circuit; and the second pixel circuit includes a second drive transistor; and
a display region, including an optical component region and a first display region, wherein the first light-emitting element is in the optical component region; and the second light-emitting element is in the first display region, wherein:
the first pixels include first blue pixels, first red pixels, and first green pixels; a width-to-length ratio of a first drive transistor corresponding to a first blue pixel is R1, a width-to-length ratio of a first drive transistor corresponding to a first red pixel is R2, and a width-to-length ratio of a first drive transistor corresponding to a first green pixel is R3,
the second pixels include second blue pixels, second red pixels, and second green pixels; a width-to-length ratio of a second drive transistor corresponding to a second blue pixel is R1', a width-to-length ratio of a second drive transistor corresponding to a second red pixel is R2', and a width-to-length ratio of a second drive transistor corresponding to a second green pixel is R3', wherein R1>R1', R2>R2', and/or R3>R3', and
among the first drive transistor corresponding to the first blue pixel, the first drive transistor corresponding to the first red pixel, and the first drive transistor corresponding to the first red pixel, at least the first drive transistor corresponding to the first blue pixel has a rectangular shaped channel.

10. The display panel according to claim 9, wherein:
a channel width of the first drive transistor corresponding to the first red pixel is W2, a channel width of the first drive transistor corresponding to the first green pixel is W3, a channel length of the first drive transistor corresponding to the first red pixel is L2, and a channel length of the first drive transistor corresponding to the first green pixel is L3, wherein |W2−W3|≤0.5 µm, and |L2−L3|≤0.5 µm.

11. The display panel according to claim 9, wherein:
the first pixel circuit includes a reset module, a data write module, and a light-emitting control module which are electrically connected to the first drive transistor; the reset module includes at least one reset transistor electrically connected to the first drive transistor; the data write module includes at least one data write transistor electrically connected to the first drive transistor; and the light-emitting control module includes at least one light-emitting control transistor electrically connected to the first drive transistor; and
a width-to-length ratio of a light-emitting control transistor corresponding to the first pixel circuit is greater than each of width-to-length ratios of the reset transistor and the data write transistor in a same first pixel circuit.

12. The display panel according to claim 11, wherein:
the first pixel circuit further includes a black state maintaining module electrically connected to the first light-emitting element, and the black state maintaining module includes at least one black state maintaining transistor electrically connected to the first light-emitting element; and
the width-to-length ratio of the light-emitting control transistor corresponding to the first pixel circuit is greater than a width-to-length ratio of the black state maintaining transistor in a same first pixel circuit.

13. The display panel according to claim 12, wherein:
the width-to-length ratio of the light-emitting control transistor corresponding to the first pixel circuit is $R_k$, wherein 6.

14. A display device with the display panel according to claim 9.

15. A display panel, comprising:
a plurality of pixels, including first pixels and second pixels, wherein each of the first pixels includes a first light-emitting element connected with a first pixel circuit; the first pixel circuit includes a first drive transistor; each of the second pixels includes a second light-emitting element connected with a second pixel circuit; and the second pixel circuit includes a second drive transistor; and
a display region, including an optical component region and a first display region, wherein the first light-emitting element is in the optical component region; and the second light-emitting element is in the first display region, wherein:
the first pixels include first blue pixels, first red pixels, and first green pixels; a width-to-length ratio of a first drive transistor corresponding to a first blue pixel is R1, a width-to-length ratio of a first drive transistor corresponding to a first red pixel is R2, and a width-to-length ratio of a first drive transistor corresponding to a first green pixel is R3, the second pixels include second blue pixels, second red pixels, and second green pixels; a width-to-length ratio of a second drive transistor corresponding to a second blue pixel is R1', a width-to-length ratio of a second drive transistor corresponding to a second red pixel is R2', and a width-to-length ratio of a second drive transistor corresponding to a second green pixel is R3', wherein R1>R1', R2>R2', and/or R3>R3',
the first pixel circuit includes a reset module, a data write module, and a light-emitting control module which are electrically connected to the first drive transistor; the reset module includes at least one reset transistor electrically connected to the first drive transistor; the data write module includes at least one data write transistor electrically connected to the first drive transistor; and the light-emitting control module includes at least one light-emitting control transistor electrically connected to the first drive transistor, and
a width-to-length ratio of a light-emitting control transistor corresponding to the first pixel circuit is greater than each of width-to-length ratios of the data write transistor in a same first pixel circuit.

16. The display panel according to claim 15, wherein:
the width-to-length ratio of the light-emitting control transistor corresponding to the first pixel circuit is greater than each of width-to-length ratios of the reset transistor in the same first pixel circuit.

17. The display panel according to claim 15, wherein:
the first pixel circuit further includes a black state maintaining module electrically connected to the first light-emitting element, and the black state maintaining module includes at least one black state maintaining transistor electrically connected to the first light-emitting element; and
the width-to-length ratio of the light-emitting control transistor corresponding to the first pixel circuit is greater than a width-to-length ratio of the black state maintaining transistor in a same first pixel circuit.

18. The display panel according to claim 15, wherein:
the width-to-length ratio of the light-emitting control transistor corresponding to the first pixel circuit is $R_k$, wherein $4 \leq R_k \leq 6$.

19. The display panel according to claim 15, wherein:
a channel width of the first drive transistor corresponding to the first red pixel is W2, a channel width of the first drive transistor corresponding to the first green pixel is W3, a channel length of the first drive transistor corresponding to the first red pixel is L2, and a channel length of the first drive transistor corresponding to the first green pixel is L3, wherein |W2−W3|≤0.5 µm, and |L2−L3|≤0.5 µm.

20. A display device with the display panel according to claim 15.

* * * * *